(12) United States Patent
Ogo et al.

(10) Patent No.: US 7,538,811 B2
(45) Date of Patent: May 26, 2009

(54) SOLID-STATE IMAGE PICKUP DEVICE THAT SUPPRESSES CROSSTALK BETWEEN PIXELS

(75) Inventors: Takahiko Ogo, Hashima (JP); Shinichiro Izawa, Motosu (JP); Kazutaka Itsumi, Anpachi-gun (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 684 days.

(21) Appl. No.: 11/212,619

(22) Filed: Aug. 29, 2005

(65) Prior Publication Data

US 2006/0050164 A1    Mar. 9, 2006

(30) Foreign Application Priority Data

Sep. 8, 2004    (JP) .............................. 2004-260944

(51) Int. Cl.
*H04N 5/335* (2006.01)
(52) U.S. Cl. ........................ 348/311; 348/294; 348/272; 257/291
(58) Field of Classification Search ................ 348/311, 348/317; 377/61–64, 68; 327/564–565
See application file for complete search history.

(56) References Cited

U.S. PATENT DOCUMENTS 7,244,978 B2 * 7/2007 Nishimura et al. .......... 257/291
2005/0046722 A1 3/2005 Okada

FOREIGN PATENT DOCUMENTS

KR    10-2005-0021886    3/2005

* cited by examiner

*Primary Examiner*—David L Ometz
*Assistant Examiner*—Antoinette T Spinks
(74) *Attorney, Agent, or Firm*—Oliff & Berridge, PLC

(57) ABSTRACT

In an image pickup portion of a frame transfer CCD image sensor, a constitution that inhibits color mixing from occurring between light-sensitive pixels adjacent along a vertical CCD shift register channel is provided. A protrusion extending on the channel is formed at a clock wiring formed on a channel stop of the vertical CCD shift register with an wiring layer having the light-shielding property. When the protrusion portion is disposed at a boundary of light-sensitive pixels in the channel, a non-light-shielding portion generated at the boundary can be suppressed. The protrusions are disposed so as to alternately protrude from the clock wirings on both sides of the channel.

5 Claims, 3 Drawing Sheets

SOLID-STATE IMAGE PICKUP DEVICE THAT SUPPRESSES CROSSTALK BETWEEN PIXELS

FIELD OF THE INVENTION

The invention relates to a solid-state image pickup device in which a CCD (Charge Coupled Device) shift register constitutes a light-sensitive pixel, and in particular, to isolation between pixels to incident light.

BACKGROUND OF THE INVENTION

In a frame transfer CCD image sensor, an image pickup portion is constituted by arranging a plurality of CCD shift registers each provided with an opening to incident light on a channel region, each bit of the CCD shift registers independently constituting a light-sensitive pixel. That is, at exposure, a clock voltage applied to a transfer electrode group disposed corresponding to each of the bits is controlled to form a potential well for each bit, and thereby a signal charge generated in accordance with light incident on the bit is accumulated in the bit. On the other hand, when an exposure period is over, the signal charge accumulated in each of the bits is transferred to an storage portion by driving the CCD shift register, followed by sequentially reading from the storage portion.

The light-sensitive pixels arranged in a column direction on the CCD shift register of the image pickup portion are formed on consecutive channel regions. Accordingly, the light-sensitive pixels adjacent to each other are fundamentally brought into contact. Color filters and interlayer films are laminated on a semiconductor substrate region constituting light-sensitive pixels. Since the light-sensitive pixels are in contact with each other in a column direction, when light enters obliquely at a boundary region of pixels, light transmitted through the color filter does not enter a light-sensitive pixel assigned to the color filter, but instead enters a light-sensitive pixel assigned to an adjacent color filter of a different color, and as a result color mixing is likely to occur. Furthermore, light incident on the boundary portion of pixels, owing to the refraction by the interlayer film, may cause crosstalk between the pixels.

As a countermeasure against this problem, it is proposed to dispose a light shield at the boundary portion of pixels. FIG. 1 is a plan view showing a structure of a so far proposed-image pickup portion. On a region corresponding to the image pickup portion on a surface of a semiconductor substrate, a plurality of CCD shift register channels 2 extending in a colum direction is formed mutually separated from each other by a channel stop (device isolation region) 4 from each other. On the semiconductor substrate, a plurality of transfer electrodes 6 that are orthogonal to the channels 2 and arranged in a column direction are laminated and formed. The transfer electrode 6 is formed of a light-transmissive material such as polysilicon. On the transfer electrode 6, a layer of metal such as aluminum (Al) having the light-shielding property is laminated and patterned, and thereby a clock wiring 8 extending on the channel stop 4 is formed. The clock wiring 8 is electrically connected through a contact 10 to the transfer electrode 6, and thereby a transfer clock can be applied to the transfer electrode 6.

In the CCD shift register constituting the image pickup portion, a three-phase drive with transfer clocks φ1 through φ3 is used, and three transfer electrodes 6-1 through 6-3 lying consecutively in the column direction constitute 1 bit of the shift register. The bit is assigned to the light-sensitive pixel of the image pickup portion. For instance, when a portion from the transfer electrode 6-1 to which a transfer clock φ1 is applied, extending to the transfer clock 6-3 to which a transfer clock φ3 is applied, is assumed to constitute 1 bit, there is a boundary of light-sensitive pixels between the transfer electrode 6-1 and the transfer electrode 6-3. A color filter is disposed on each of the light-sensitive pixels. For instance, here, the color filters are arranged in a Bayer matrix and color filters that are different in color 12-1 and 12-2 are interleaved in each column.

A light shield 14 disposed at the boundary portion between pixels, when the light shielding metal layer is patterned, is formed simultaneously with the clock wiring 8.

The light shield 14 is formed as a pattern located on the channel 2 and separated from both clock wirings 8 on both sides of the channel. That is, a gap of the light-shielding metal layer is disposed on each of portions between the light shield 14 and the clock wirings 8 on both sides. Light obliquely incident on the gap portion causes crosstalk and color mixing between adjacent pixels in the column direction. Accordingly, the light shield 14 cannot sufficiently inhibit color mixing or the like from occurring.

SUMMARY OF THE INVENTION

The invention was carried out to overcome the foregoing problems and intends to provide, by imparting an excellent light-shielding property at a boundary portion of light-sensitive pixels disposed in a channel of a CCD shift register to preferably suppress the crosstalk between pixels from occurring, a solid-state image pickup device in which color mixing is alleviated.

A solid-state image pickup device according to the invention includes an image pickup region where a plurality of light-sensitive pixels arranged in a matrix, and a plurality of shift registers that transfer, in a column direction, a signal charge generated for each of the light-sensitive pixels are formed, the shift registers having a plurality of transfer electrodes arranged plurally in the column direction and transferring the signal charge at the shift register and a plurality of clock wirings extending respectively in the column direction between columns of the light-sensitive pixels and supplying each phase of the transfer clocks of a plurality of phases to the transfer electrode, the clock wiring being formed of a light-shielding material and having a protrusion extending on the boundary between the light-sensitive pixels arranged in the column direction.

According to the invention, since there is only one gap generated in the light-shielding material at the boundary portion of the light-sensitive pixels disposed in the channel of the CCD shift register, a ratio of the gap in the boundary can be reduced. As a result, the crosstalk between the pixels can be suppressed to alleviate color mixing or the like.

DESCRIPTION OF THE PREFERRED EMBODIMENTS

In the following, implementation modes (hereinafter referred to as embodiments) of the invention will be described with reference to the drawings.

Embodiment 1

A solid-state image pickup device according to the embodiment is a frame transfer CCD image sensor. The image sensor includes an image pickup portion, a storage portion, a horizontal transfer portion and an output portion, all formed on a surface of a semiconductor substrate.

Each of the image pickup portion and storage portion includes a plurality of vertical CCD shift registers arranged in a row (line) direction. The vertical CCD shift register constituting the image pickup portion is constituted so as to be capable of letting light in the channel region thereof, each bit constituting a light-sensitive pixel, and for each of the light-sensitive pixels a signal charge in accordance with the incident light is generated and accumulated. An output terminal of the vertical CCD shift register of the image pickup portion is connected to an input terminal of the vertical CCD shift register in the storage portion, and at the completion of the exposure period the signal charge accumulated in the image pickup portion is frame-transferred to the storage portion. The storage portion is covered with a light-shielding film and accumulates the signal charge transferred from the image pickup portion. A horizontal transfer portion horizontally transfers the signal charge read one line at a time from the storage portion to an output portion, and the output portion converts the signal charge into a voltage signal for output as an image signal.

Figure 2:
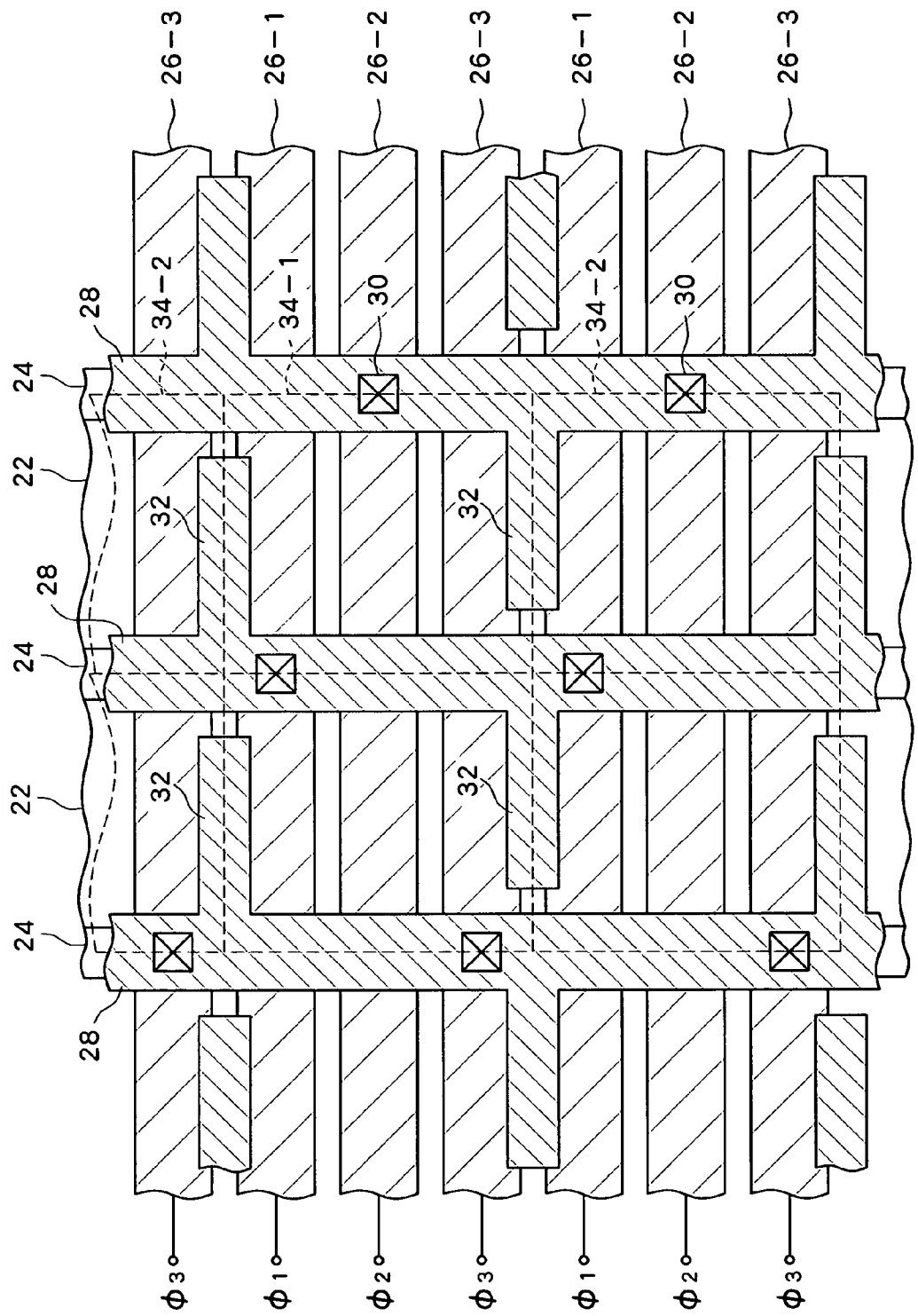
FIG. 2 is a schematic plan view showing a structure of an image pickup portion of a frame transfer CCD image sensor that is a first embodiment according to the invention.

FIG. 2 is a schematic plan view showing a structure of an image pickup portion of a frame transfer CCD image sensor according to a first embodiment of the invention. On a region corresponding to an image pickup portion on a surface of a semiconductor substrate, a plurality of CCD shift register channels 22 extending in a column direction are formed. The plurality of channels 22 are mutually separated by a channel stop 24. On the semiconductor substrate, a plurality of transfer electrodes 26 arranged orthogonal to the channel 22 and arranged in a column direction are formed. The transfer electrode 26 is made of a light-transmissive material such as polysilicon. On the transfer electrode 26, an wiring layer made of a metal film having a light shielding property, such as an Al layer, is laminated and patterned, thereby forming a clock wiring 28 extending on the channel stop 24. The clock wiring 28 is electrically connected through a contact 30 to the transfer electrode 26 making it possible to apply a transfer clock to the transfer electrode 26.

The CCD shift register constituting the image pickup portion is driven according to a three-phase drive with transfer clocks $\phi 1$ through $\phi 3$, and three transfer electrodes 26 lying consecutively in the column direction constitute 1 bit of the shift register. This bit is assigned to the light-sensitive pixel of the image pickup portion. For instance, when a portion from a transfer electrode 26-1 to which a transfer clock $\phi 1$ is applied, extending to a transfer clock 26-3 to which a transfer clock $\phi 3$ is applied, is assumed to constitute 1 bit, there is a boundary of light-sensitive pixels between the transfer electrode 26-1 and the transfer electrode 26-3.

The clock wiring 28 has a protrusion 32 extending horizontally at the boundary position of the light-sensitive pixels. In each of the CCD shift register channels 22, the protrusions 32 extend alternately from the clock wirings 28 on both sides. That is, for instance, at a pixel boundary between the $(2i-1)^{th}$ line (i is an integer) and the $2i^{th}$ line, a protrusion 32 extends from the channel 22 on one side, and at a pixel boundary between the $2i^{th}$ line and the $(2i+1)^{th}$ line a protrusion 32 extends from the channel 22 on the other side.

On an wiring layer, a color filter having the color transmitting property corresponding to each of the light-sensitive pixels is disposed. For instance, here, the color filters are arranged in a Bayer matrix and in each column color filters 34-1 and 34-2 of different colors are disposed alternately.

In the clock wirings 28 adjacent in the row direction, in order to supply phases different from each other among the transfer clocks $\phi 1$ through $\phi 3$, the protrusion 32 is not connected to the clock wiring 28 on the opposite side and a gap is disposed between a tip end of the protrusion 32 and the clock wiring 28. The gap, which is capable of causing a color mixing component of an image signal owing to light obliquely entering at that point, is formed as small as possible. Furthermore, like the embodiment, when the gap is disposed at an end of the channel 22, namely, adjacent to the channel stop 24, light obliquely incident on the gap has a high probability of being absorbed at a region of the channel stop 24, resulting in suppressing and alleviating color mixing.

Furthermore, when the protrusions 32 are extended not only from the clock wiring 28 on one side but also alternately from the clock wirings 28 on both sides, it is expected to suppress the fluctuations in an amount of color mixing component in accordance with a direction of incident light, and as a result stabilization of image quality can be achieved.

A width of the protrusion 32, according to a geometrical consideration based on a gap between the protrusion 32 and the semiconductor substrate and an estimated angle of incident light, is determined so as to be able to suitably separate between adjacent pixels to obliquely incident light. At that time, within a range that can realize the suitable separation between the adjacent pixels to obliquely incident light, the width of the protrusion 32 is made as narrow as possible. Therefore, an increase in the parasitic capacitance of the clock wiring 28 can be suppressed and the blunting of a waveform of a transfer clock can be avoided.

Pixel sizes are becoming smaller due to the requirements for downsizing and increasing pixel density of CCD image sensors. However, the width of the gap cannot necessarily be miniaturized in conjunction with the pixel size. That is, regarding the width of the gap, there is a lower limit stipulated by the processing technology, such as etching of the light-shielding metal layer. In general, as the pixel size is made smaller, a ratio at which the gap occupies in the pixel boundary portion tends to be larger.

Figure 1:
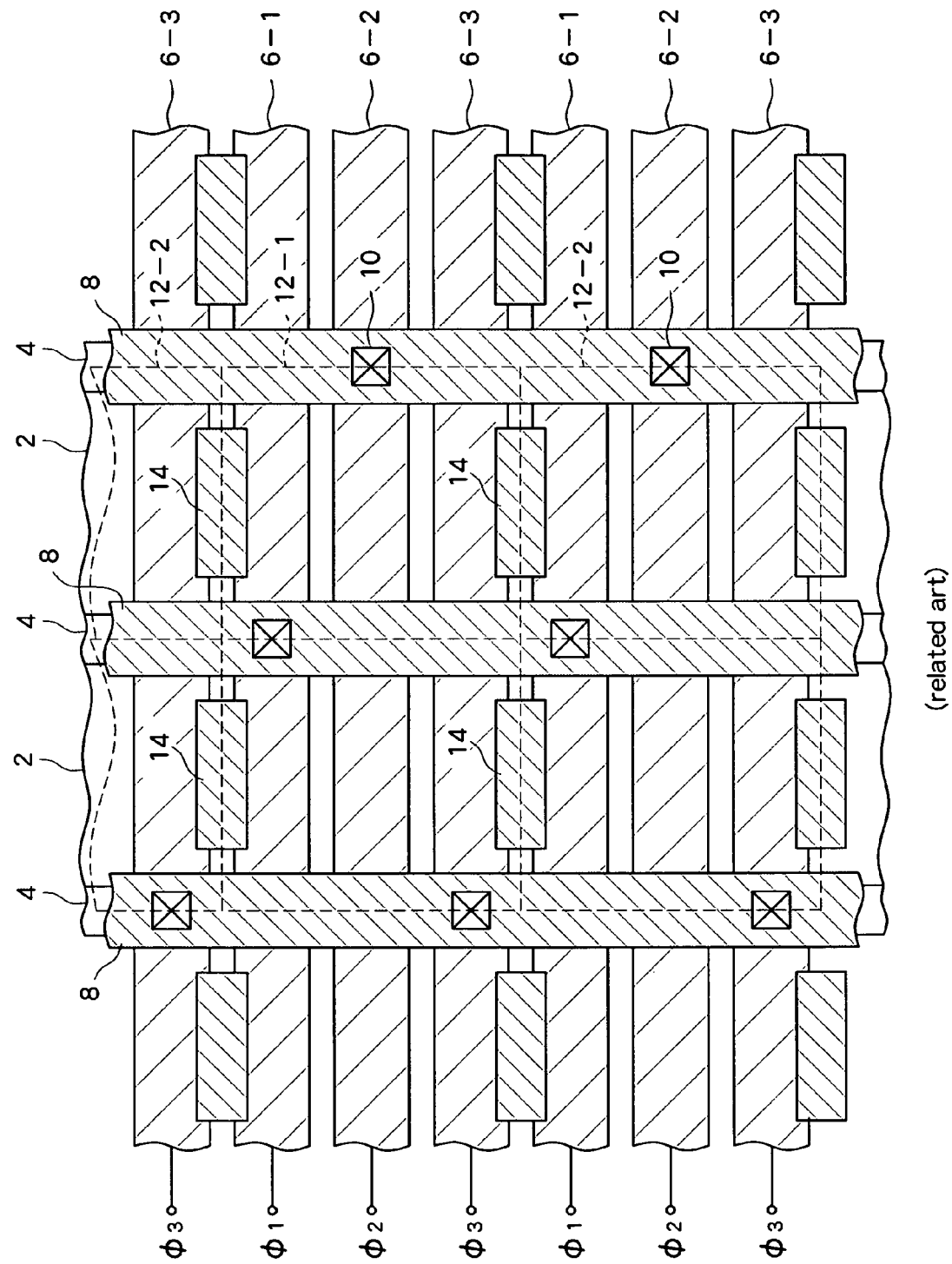
FIG. 1 is a plan view showing a structure of a so far proposed image pickup portion.

Accordingly, with existing technology where a light-shield such as shown in FIG. 1 is disposed, there is a problem in that an increase in the color mixing component in the signal charge of each of the pixels can be significant. However, in the solid-state image pickup device according to the embodiment, even in a CCD image sensor having miniaturized pixel size, the color mixing component can be prevented from increasing.

Embodiment 2

A solid-state image pickup device according to the embodiment is an interline transfer CCD image sensor. The image sensor is constituted with an image pickup portion, a horizontal transfer portion and an output portion formed on a surface of a semiconductor substrate.

In the image pickup portion, pluralities of light-sensitive pixels (light-sensitive pixel column) arranged in a column direction and vertical CCD shift registers are alternately arranged in a row direction. The vertical CCD shift register, light-shielded with a metal film on a transfer channel thereof and having channel stops on both sides, vertically transfers signal charges transferred from the adjacent light-sensitive pixels. The horizontal transfer portion horizontally transfers a signal charge read one line at a time from the vertical CCD shift registers and the output portion converts the signal charge into a voltage signal for output as an image signal.

Figure 3:
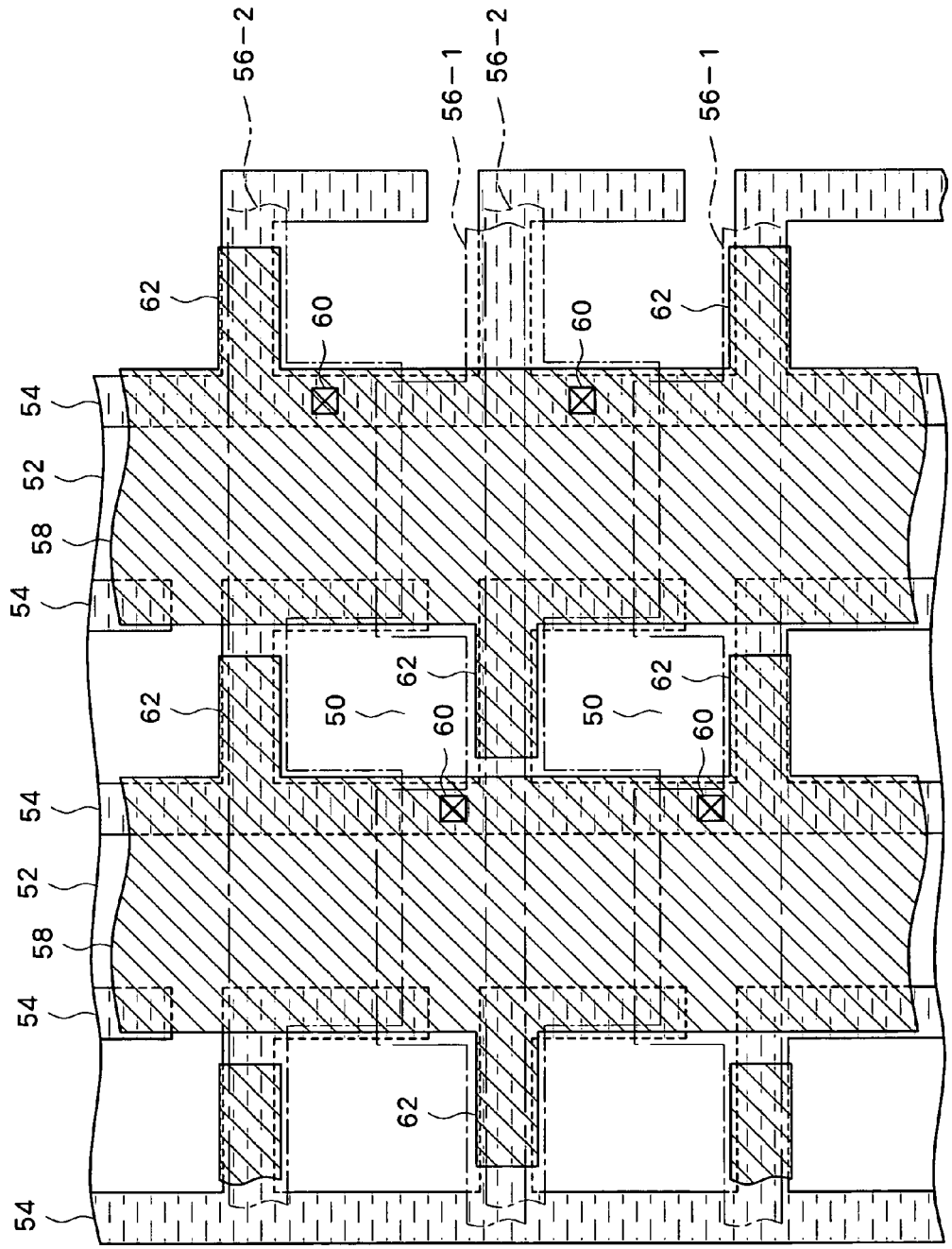
FIG. 3 is a schematic plan view showing a structure of an image pickup portion of a interline transfer CCD image sensor that is a second embodiment according to the invention.

FIG. 3 is a schematic plan view showing a structure of an image pickup portion of an interline transfer CCD image sensor that is a second embodiment according to the invention. On a surface of a semiconductor substrate of the image pickup portion, a light-sensitive pixel region 50 and a CCD shift register channel 52 both extending in a column direction are formed mutually isolated by a channel stop 54. On the semiconductor substrate, a plurality of transfer electrodes 56 that are orthogonal to the channel 52 and arranged in a column direction are formed. The transfer electrode 56 is made of a light-transmissive material such as polysilicon. On the transfer electrode 56, an wiring layer made of a metal film having a light shielding property, such as an Al layer, is laminated and patterned, thereby forming a light-shielding film 58 extending on the vertical CCD shift register channel 52. In the image sensor, the light-shielding film 58 is used as a clock wiring that supplies the transfer clock to the transfer electrode 56. The light-shielding film 58 is electrically connected through, for instance, a contact 60 disposed on the channel stop 54 to the transfer electrode 56 and as a result a transfer clock can be applied to the transfer electrode 56.

A transfer electrode 56-1 is formed by use of a first polysilicon layer and a transfer electrode 56-2 is formed by use of a second polysilicon layer stacked thereon. In a channel 52 below each of the transfer electrodes, a storage region and a barrier region are formed according to the impurity implantation, and a vertical CCD shift register is constituted in a two-phase drive with transfer clocks $\phi 1$ and $\phi 2$.

The light-sensitive pixels arranged in a column direction are separated by a channel stop 54 horizontally disposed at a boundary position thereof. The light-shielding film 58 has a protrusion 62 extending horizontally on the channel stop 54 at the boundary positions of the light-sensitive pixels. In each of the light-sensitive pixel columns, the protrusions 62 extend alternately from the light-shielding film 58 on both sides. That is, at a pixel boundary between, for instance, the (2i−1) line (i is an integer) and the 2i line, a protrusion 62 extends from the light-shielding film 58 of the vertical CCD shift register adjacent the light-sensitive pixel column on one side, and at the pixel boundary between the 2i line and the (2i+1) line a protrusion 62 extends from the light-shielding film 58 of the vertical CCD shift register adjacent on the other side.

In accordance with each of the light-sensitive pixels, a color filter having the predetermined color transmitting property is disposed. For instance, here, the color filters are arranged in a Bayer matrix and in each column color filters of different colors are disposed alternately.

When the protrusion 62 is disposed as mentioned above on the light-shielding films 58 adjacent in a column direction, while utilizing the respective light-shielding films 58 as clock wirings supplying transfer clocks mutually different in the phase, color mixing between light-sensitive pixels owing to obliquely incident light can be inhibited or alleviated.

What is claimed is:

1. A solid-state image pickup device comprising:
   an image pickup region, where a plurality of light-sensitive pixels are arranged in a matrix; and a plurality of shift registers that transfer a signal charge generated for each of the light-sensitive pixels in a column direction are formed;
   wherein the shift register has a plurality of transfer electrodes arranged plurally in a column direction and transferring the signal charge at the shift register; and
   a plurality of clock wirings extended respectively in the column direction between light-sensitive pixel columns and supplying each phase of a plurality of phases of transfer clocks to the transfer electrode; and wherein
   the clock wiring is formed of a light-shielding material and has a protrusion extending on a boundary between the light-sensitive pixels arranged in the column direction.

2. The solid-state image pickup device according to claim 1, wherein on each of the boundaries, one protrusion extended from any one of the clock wirings on both sides of the light-sensitive pixel column is disposed.

3. The solid-state image pickup device according to claim 2, wherein a plurality of the protrusions arranged in the column direction in each of the light-sensitive pixel columns are extended alternately from the clock wirings on both sides of the light-sensitive pixel column.

4. The solid-state image pickup device according to claim 1, wherein the respective shift registers constitute the light-sensitive pixel column; and
   the plurality of clock wirings are formed on channel stop regions that isolate between the plurality of shift registers.

5. The solid-state image pickup device according to claim 1, wherein color filters having mutually different color transmission properties are disposed on the light-sensitive pixels adjacent in the column direction color filters.

* * * * *